United States Patent
Chen et al.

(10) Patent No.: US 10,256,332 B1
(45) Date of Patent: Apr. 9, 2019

(54) HIGH HOLE MOBILITY TRANSISTOR

(71) Applicant: Vanguard International Semiconductor Corporation, Hsinchu (TW)

(72) Inventors: Fu-Hsin Chen, Jhudong Township (TW); Yung-Hao Lin, Jhunan Township (TW); Shin-Cheng Lin, Tainan (TW); Hsin-Chih Lin, Hsinchu (TW); Chia-Ching Huang, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/795,526

(22) Filed: Oct. 27, 2017

(51) Int. Cl.
*H01L 29/15* (2006.01)
*H01L 31/0256* (2006.01)
(Continued)

(52) U.S. Cl.
CPC ...... *H01L 29/7783* (2013.01); *H01L 23/3171* (2013.01); *H01L 29/2003* (2013.01);
(Continued)

(58) Field of Classification Search
CPC ........... H01L 29/66462; H01L 29/7783; H01L 29/7786; H01L 29/1029; H01L 29/66431; H01L 21/8238; H01L 29/165; H01L 29/267; H01L 29/432; H01L 29/51; H01L 2924/1306; H01L 29/205; H01L 29/1066; H01L 29/7782; H01L 29/778; H01L 29/66; H01L 29/10; H01L 29/737; H01L 21/331; H01L 21/335; H01L 27/144; H01L 29/2003; H01L 29/207; H01L 29/42364; H01L 23/291; H01L 23/293; H01L 23/66462
(Continued)

(56) References Cited

U.S. PATENT DOCUMENTS

2007/0267655 A1* 11/2007 Endoh ............... H01L 29/66462 257/194
2008/0237606 A1* 10/2008 Kikkawa ........... H01L 29/66462 257/76
(Continued)

FOREIGN PATENT DOCUMENTS

CN 101790790 A 7/2010

*Primary Examiner* — Niki H Nguyen
(74) *Attorney, Agent, or Firm* — Birch, Stewart, Kolasch & Birch, LLP

(57) ABSTRACT

A high hole mobility transistor includes a substrate, a back-barrier layer, a conducting layer, a doping layer, a gate electrode, source/drain electrodes, and a band adjustment layer. The back-barrier layer is disposed on the substrate. The conducting layer is disposed on the back-barrier layer. A channel region is disposed in the conducting layer and is adjacent to the interface between the conducting layer and the back-barrier layer. The doping layer is disposed on the conducting layer. The gate electrode is disposed on the doping layer. The source/drain electrodes are disposed on opposite sides of the gate electrode. The band adjustment layer is disposed on the doping layer and electrically connected to the gate electrode. The band adjustment layer is an N-type doped III-V semiconductor.

13 Claims, 5 Drawing Sheets

(51) Int. Cl.
| | |
|---|---|
| *H01L 29/778* | (2006.01) |
| *H01L 29/205* | (2006.01) |
| *H01L 29/20* | (2006.01) |
| *H01L 29/207* | (2006.01) |
| *H01L 29/423* | (2006.01) |
| *H01L 23/31* | (2006.01) |
| *H01L 29/66* | (2006.01) |
| *H01L 23/29* | (2006.01) |

(52) U.S. Cl.
CPC .......... *H01L 29/205* (2013.01); *H01L 29/207* (2013.01); *H01L 29/42364* (2013.01); *H01L 23/291* (2013.01); *H01L 23/293* (2013.01); *H01L 29/66462* (2013.01)

(58) Field of Classification Search
USPC ............... 257/183, 197, 198, 76; 438/172
See application file for complete search history.

(56) References Cited

U.S. PATENT DOCUMENTS

| | | |
|---|---|---|
| 2009/0001350 A1 | 1/2009 | Hudait et al. |
| 2010/0117118 A1* | 5/2010 | Dabiran ................ H01L 29/207 257/190 |
| 2014/0183598 A1* | 7/2014 | Chiu ................ H01L 29/42364 257/190 |
| 2015/0041820 A1* | 2/2015 | Renaud ................ H01L 29/778 257/76 |
| 2015/0155376 A1 | 6/2015 | Cho et al. |
| 2015/0221727 A1 | 8/2015 | Kub et al. |
| 2015/0325680 A1 | 11/2015 | Isobe et al. |
| 2016/0211358 A1* | 7/2016 | Hung ................ H01L 21/02458 |

* cited by examiner

HIGH HOLE MOBILITY TRANSISTOR

BACKGROUND

Technical Field

The disclosure relates to a semiconductor technology, and more particularly to a high hole mobility transistor (HHMT).

Description of the Related Art

GaN is widely applied in high-power semiconductor devices due to its many advantages, which include wide band gap and high-speed electrons. GaN is applied especially frequently in the field of radio frequency (RF) and power.

Traditionally, the high electron mobility transistor (HEMT) has a stack of III-V semiconductors, and a heterojunction is formed at its interface. Due to the band bending at the heterojunction, a potential well is formed at the bending conduction band so that a two-dimensional electron gas (2DEG) is formed in the potential well. The carriers in the channel are electrons, and therefore the high electron mobility transistor is an N-type device.

Traditionally, we may also utilize stacked III-V semiconductors to form a two-dimensional hole gas (2DHG) at the interface. Furthermore, the band structure may change by gate recessing, and the two-dimensional hole gas is suppressed to form an enhancement mode (E-mode) high hole mobility transistor (HHMT). However, it is not easy to control the gate recess depth and uniformity, and this may cause the electrical parameters to degrade. In addition, the gate recessed region may also cause high channel resistance.

Although existing high hole mobility transistors have generally been adequate for their intended purposes, they have not been entirely satisfactory in all respects and need to be improved, especially the uniformity and the channel resistance of high hole mobility transistors.

BRIEF SUMMARY

The present disclosure provides a high hole mobility transistor (HHMT). The high hole mobility transistor includes a back-barrier layer disposed on a substrate. The high hole mobility transistor also includes a conducting layer disposed on the back-barrier layer. The high hole mobility transistor also includes a channel region disposed in the conducting layer adjacent to the interface between the conducting layer and the back-barrier layer. The high hole mobility transistor also includes a doping layer disposed on the conducting layer. The high hole mobility transistor also includes a gate electrode disposed on the doping layer. The high hole mobility transistor also includes source/drain electrodes disposed on opposite sides of the gate electrode. The high hole mobility transistor also includes a band adjustment layer disposed on the doping layer and electrically connected to the gate electrode. The band adjustment layer is an N-type doped III-V semiconductor.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion

DETAILED DESCRIPTION

Figure 1:
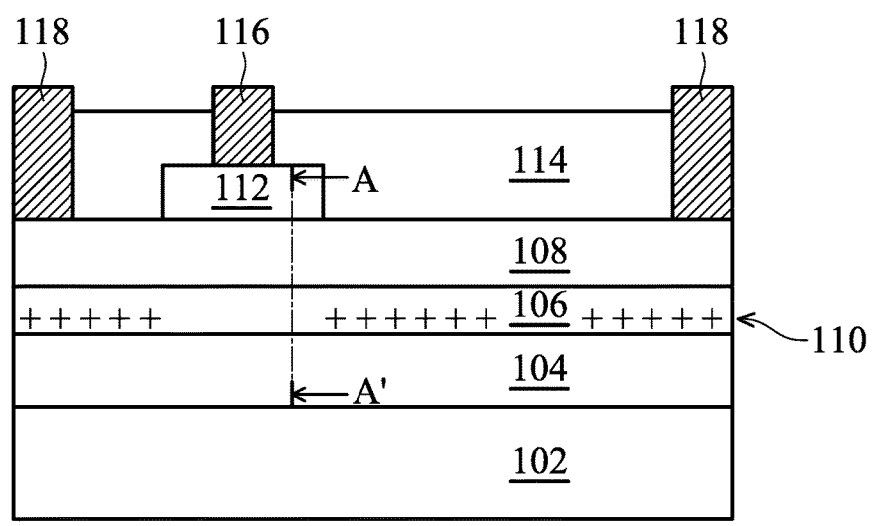
FIG. 1 is a cross-sectional representation of a high hole mobility transistor in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

The embodiments of the present disclosure provide a high hole mobility transistor (HHMT) in which a band adjustment layer is formed on the channel region to lower the energy band and eliminate two-dimensional hole gas (2DHG). In this way, an enhancement mode (E-mode) high hole mobility transistor (HHMT) is formed. Compared to the devices produced by conventional process, the uniformity of the HHMT in the present disclosure is better, and the channel resistance is still at a low level.

FIG. 1 is a cross-sectional representation of a high hole mobility transistor 100 in accordance with some embodiments of the present disclosure. As shown in FIG. 1, a substrate 102 is provided. In some embodiments, the substrate 102 may include Si, SiC, or $Al_2O_3$ (sapphire). The substrate 102 may be a single-layer substrate, a multi-layer substrate, a gradient substrate, another suitable substrate, or a combination thereof. In some embodiments, the substrate 102 may be a monocrystal substrate. In some embodiments, the substrate 102 may also include a semiconductor on insulator (SOI) substrate. The above SOI substrate may include a base plate, a buried oxide (BOX) layer disposed on the base plate, or a semiconductor layer disposed on the buried oxide (BOX) layer. In some embodiments, the substrate 102 may include one or more buffer layers to prevent lattice mismatch between the silicon substrate and the devices formed thereon. In some embodiments, the substrate 102 may also include III-V semiconductors such as GaN, AlGaN, AlN, GaAs, AlGaAs, InP, InAlAs, InGaAs, or a combination thereof. In some embodiments, the substrate 102 may be a substrate material that can withstand high voltage.

Next, a back-barrier layer 104 is formed on the substrate 102. In some embodiments, the back-barrier layer 104 includes a III-V semiconductor such as $Al_xGa_{1-x}N$ or $Al_xIn_yGa_{1-x-y}N$, wherein $0<x<1$ and $0<y<1$. In some embodiments, the thickness of the back-barrier layer 104 is between 0.1 μm and 5 μm. In some embodiments, the back-barrier layer 104 is formed on the substrate 102 by molecular-beam epitaxy (MBE), metalorganic chemical vapor deposition (MOCVD), chemical vapor deposition (CVD), hydride vapor phase epitaxy (HVPE), another suitable method, or a combination thereof.

Next, a conducting layer 106 is formed on the back-barrier layer 104. In some embodiments, the conducting layer 106 includes an undoped III-V semiconductor such as undoped GaN. In some embodiments, the thickness of the conducting layer 106 is between 0.1 μm and 5 μm. In some embodiments, the conducting layer 106 is formed on the back-barrier layer 104 by molecular-beam epitaxy (MBE), metalorganic chemical vapor deposition (MOCVD), chemical vapor deposition (CVD), hydride vapor phase epitaxy (HVPE), another suitable method, or a combination thereof.

Next, a doping layer 108 is formed on the conducting layer 106. In some embodiments, the doping layer 108 includes a P-type III-V semiconductor such as P-type doped GaN. In some embodiments, the doping layer 108 may be doped by Mg, Zn, Ca, Be, Sr, Ba, Ra, or C, and the P-type doping concentration is between $1e15/cm^3$ and $1e20/cm^3$. The thickness of the doping layer 108 is between 0.1 μm and 5 μm. In some embodiments, the doping layer 108 may be formed on the conducting layer 106 by molecular-beam epitaxy (MBE), metalorganic chemical vapor deposition (MOCVD), chemical vapor deposition (CVD), hydride vapor phase epitaxy (HVPE), another suitable method, or a combination thereof. In some embodiments, the doping layer 108 is formed by in-situ doping or by ion implantation.

Since the material band gaps of the doping layer 108/ conducting layer 106 and the back-barrier layer 104 are different, a heterojunction is formed at the interface between doping layer 108/conducting layer 106 and the back-barrier layer 104. Moreover, the doping layer 108 is doped with a P-type dopant to raise the energy band and the band is bended at the heterojunction. A quantum well is formed where the valence band bends and the holes are confined in the quantum well. Therefore, a two-dimensional hole gas (2DHG) is formed at the interface between the conducting layer 106 and the back-barrier layer 104, and then a conducting current is formed. As shown in FIG. 1, a channel region 110 is formed at the interface between the conducting layer 106 and the back-barrier layer 104. The channel region 110 is where the conducting current formed by the two-dimensional hole gas (2DHG). The thickness of the channel region 110 is between 1 nm and 100 nm.

Next, a band adjustment layer 112 is formed on the doping layer 108. In some embodiments, the band adjustment layer 112 is an N-type doped III-V semiconductor such as N-type doped GaN, AlGaN, AlN, GaAs, AlGaAs, InP, InAlAs, or InGaAs. The N-type doping concentration is between $1e15/cm^3$ and $1e20/cm^3$. The thickness of the band adjustment layer 112 is between 10 nm and 5000 nm. In some embodiments, the band adjustment layer 112 may be formed by molecular-beam epitaxy (MBE), metalorganic chemical vapor deposition (MOCVD), chemical vapor deposition (CVD), hydride vapor phase epitaxy (HVPE), another suitable method, or a combination thereof to deposit an N-type doped III-V semiconductor. After that, the N-type doped III-V semiconductor is patterned by processes such as a photolithography process and an etching process. In some embodiments, the band adjustment layer 112 is disposed beneath the subsequently formed gate electrode.

Since the band adjustment layer 112 is doped with an N-type dopant, the energy band may be lower, and the high hole mobility transistor 100 is an enhancement mode (E-mode) high hole mobility transistor (described in detail later). Compared to depletion mode (D-mode) high hole mobility transistors, E-mode high hole mobility transistors are safer, and the standby power dissipation is lower. The circuit complexity and the production cost may also be reduced.

Next, a passivation layer 114 is formed on the doping layer 108 and the band adjustment layer 112. The passivation layer 114 may include $SiO_2$, $SiN_3$, SiON, $Al_2O_3$, polyimide (PI), benzocyclobutene (BCB), or polybenzoxazole (PBO), another insulating material, or a combination thereof. The thickness of the passivation layer 114 is between 0.1 μm and 1 μm. In some embodiments, the passivation layer 114 is formed by metalorganic chemical vapor deposition (MOCVD), chemical vapor deposition (CVD), spin-coating, another suitable method, or a combination thereof. In some embodiments, the passivation layer 114 may be conformally formed on the doping layer 108 and the band adjustment layer 112. In some embodiments, the passivation layer 114 has a flat top surface by a chemical mechanical polishing (CMP) process. The passivation layer 114 may protect the layers below, and provide physical isolation and structure support.

Next, a gate electrode 116 is formed on the band adjustment layer 112, and source/drain electrodes 118 are formed on opposite sides of the gate electrode 116. In some embodiments, the gate electrode 116 may include metal, polysilicon, metal silicide, another suitable conductive material, or a combination thereof. In some embodiments, the source/drain electrodes 118 may include Ti, Al, Au, Pd, another suitable metal, its alloy, or a combination thereof. In some embodiments, openings may be formed in the passivation layer 114 by a photolithography and an etching process to expose a part of the band adjustment layer 112 and the doping layer 108. The electrode material is then filled in the openings of the passivation layer 114 by electroplating, sputtering, resistive heating evaporation, e-beam evaporation, physical vapor deposition (PVD), chemical vapor deposition (CVD), atomic layer deposition (ALD), another suitable method, or a combination thereof to form the gate electrode 116 and the source/drain electrodes 118.

The embodiment in FIG. 1 is merely an example, and the embodiments of the present disclosure are not limited thereto. For example, some other doping layers may also be formed on the doping layer 108 (not shown), and the dopant and the doping concentration may be the same with or different than that of the doping layer 108. In this way, it is freer to adjust the band structure of the high hole mobility transistor by modifying the composition and the concentration of different doping layers.

Figure 2:
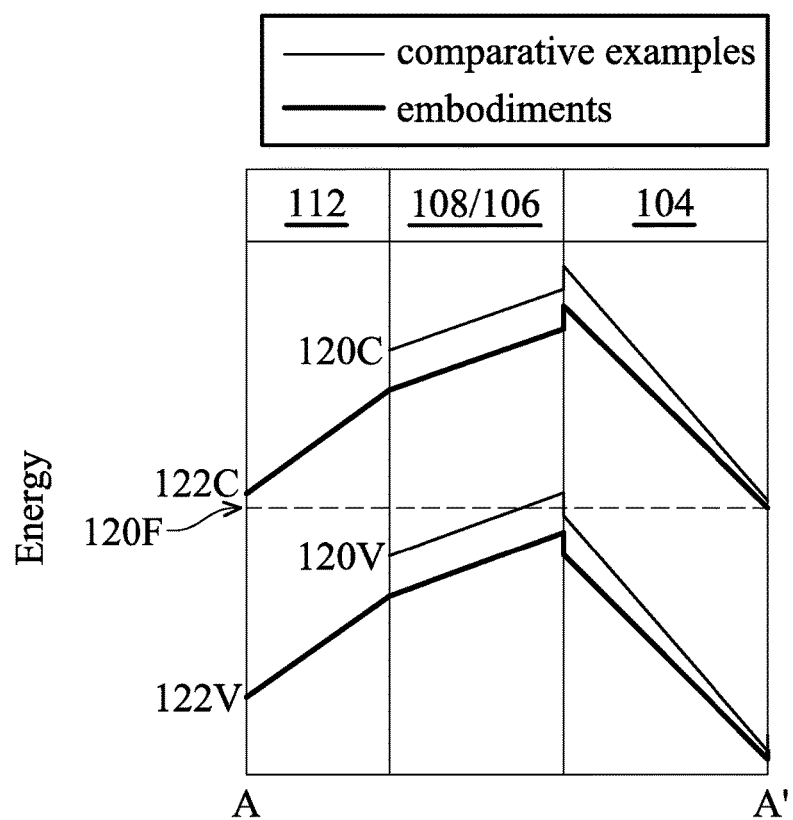
FIG. 2 is a band diagram of high hole mobility transistors in accordance with some embodiments.

FIG. 2 is a band diagram of cross-sectional view along the line AA' in FIG. 1. The comparative example is a band structure including a conductive band 120C and a valence band 120V of a high hole mobility transistor without the band adjustment layer 112. The embodiment is a band structure including a conductive band 122C and a valence band 122V of a high hole mobility transistor with the band adjustment layer 112. In the comparative example in FIG. 2, the P-type doping layer 108 makes the quantum well energy at the interface between the conducting layer 106 and the back-barrier layer 104 is higher than a Fermi level 120F. Therefore, in the conducting layer, a two-dimensional hole gas (2DHG) is formed above the Fermi level and a conducting current is formed.

In the embodiment in FIG. 2, the band adjustment layer 112 is an N-type doped III-V semiconductor. The N-type doping lower the band and makes the valance band 122V energy at the interface between the conducting layer 106 and the back-barrier layer 104 is lower than the Fermi level 120F. Therefore, no two-dimensional hole gas (2DHG) is formed and there is no conducting current.

In the above embodiment, since the band adjustment layer 112 has lowered the energy band, the high hole mobility transistor 100 is cut off when no gate voltage is applied. Therefore, the high hole mobility transistor 100 is an enhancement mode (E-mode) high hole mobility transistor.

As mentioned above, in the present disclosure, a band adjustment layer is disposed on the channel region of the high hole mobility transistor. The band structure may be adjusted by N-type doping and an enhancement mode (E-mode) high hole mobility transistor is formed. Since it is not formed by the conventional gate recess process, the issue of worse uniformity due to recessed gate may be prevented and the channel resistance is still low.

Figure 3:
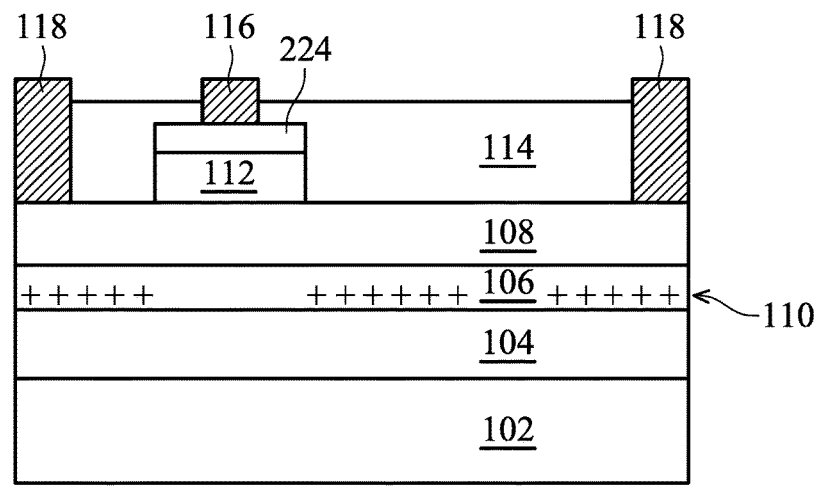
FIG. 3 is a cross-sectional representation of a high hole mobility transistor in accordance with some embodiments.

FIG. 3 is a cross-sectional representation of a high hole mobility transistor 200 in accordance with another embodiment of the present disclosure. Some processes or devices are the same as, or similar to, those described in the embodiments above, and therefore they use the same symbols. For the purpose of brevity, the descriptions of these processes and devices are not repeated herein. The difference from the embodiments described above is that a dielectric layer 224 is further disposed between the band adjustment layer 112 and the gate electrode 116, and a metal-insulator-semiconductor (MIS) structure is formed. The dielectric layer 224 may include $SiO_2$, $SiN_3$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, $AlSiN_3$, SiC, $Ta_2O_5$, similar material, or a combination thereof. In some embodiments, a dielectric material is deposited by chemical vapor deposition (CVD), plasma enhanced chemical vapor deposition (PECVD), high density plasma chemical vapor deposition (HDPCVD), atomic layer deposition (ALD), spin-coating, and/or another suitable technique. The dielectric material is then patterned by processes such as a photolithography process and an etching process to form the dielectric layer 224. The dielectric layer 224 may lower the gate leakage current, raise the withstand gate voltage, and further lower the channel resistance. The thickness of the dielectric layer 224 is between 1 nm and 100 nm. If the dielectric layer 224 is too thick, the device speed may degrade. If the dielectric layer is too thin, the gate leakage current may rise.

In the embodiment shown in FIG. 3, a dielectric layer is dispose in between the band adjustment layer and the gate electrode of the enhancement mode high hole mobility transistor. The gate leakage current may be lower, and the withstand gate voltage may be higher.

Figure 4:
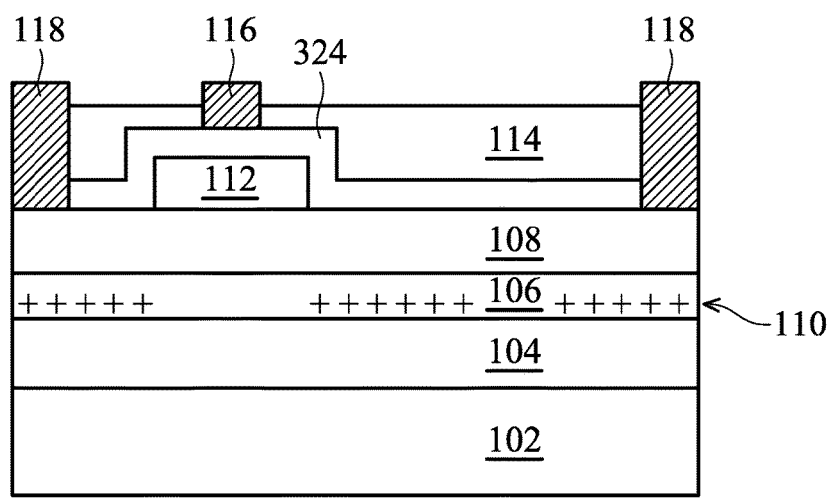
FIG. 4 is a cross-sectional representation of a high hole mobility transistor in accordance with some embodiments.

FIG. 4 is a cross-sectional representation of a high hole mobility transistor 300 in accordance with another embodiment of the present disclosure. Some processes or devices are the same as, or similar to, those described in the embodiments above, and therefore they use the same symbols. For the purpose of brevity, the descriptions of these processes and devices are not repeated herein. The difference from the embodiments described above is that a dielectric layer 324 extends to the top surface of the doping layer 108.

Compared to the process of the high hole mobility transistor 200, in the process of the high hole mobility transistor 300 the dielectric layer 324 is conformally formed on the doping layer 108 and the band adjustment layer 112 after the band adjustment layer 112 is formed. After that, the passivation layer 114 is formed.

The dielectric layer 324 may lower the gate leakage current, raise the withstand gate voltage, and further lower the channel resistance. Meanwhile, since the dielectric layer 324 is not etched, the process of the high hole mobility transistor 300 may save production time and cost.

Figure 5:
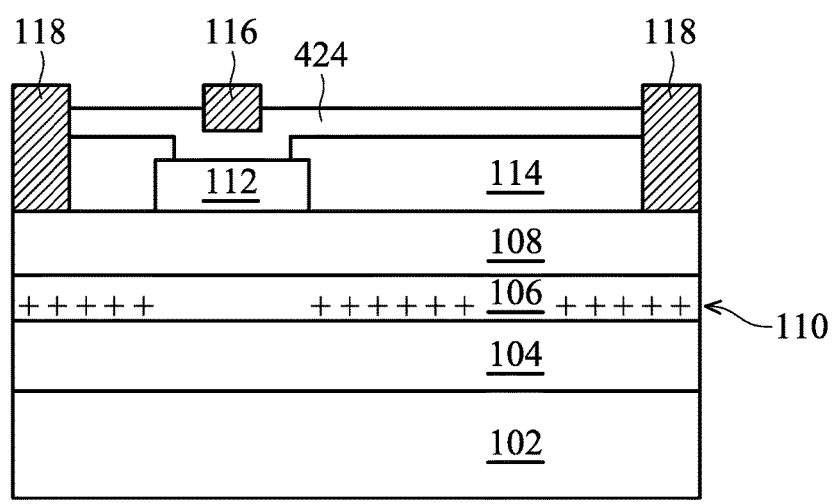
FIG. 5 is a cross-sectional representation of a high hole mobility transistor in accordance with some embodiments.

FIG. 5 is a cross-sectional representation of a high hole mobility transistor 400 in accordance with another embodiment of the present disclosure. Some processes or devices are the same as, or similar to, those described in the embodiments above, and therefore they use the same symbols. For the purpose of brevity, the descriptions of these processes and devices are not repeated herein. The difference from the embodiments described above is that the dielectric layer 424 extends to the top surface of the passivation layer 114.

Compared to the process of the high hole mobility transistor 200, in the process of the high hole mobility transistor 400 an opening is formed in the passivation layer 114 by processes such as a photolithography process and an etching process after the passivation layer 114 is formed. A part of the band adjustment layer 112 is exposed. Next, the dielectric layer 424 is conformally formed on the band adjustment layer 112 and the passivation layer 114. After that, the gate electrode 116 is formed.

The dielectric layer 424 may lower the gate leakage current, raise the withstand gate voltage, and further lower the channel resistance. The process of the high hole mobility transistor 400 provides another way to form dielectric layer 424 depending on the process demands.

As mentioned above, the present disclosure provides a high hole mobility transistor (HHMT) structure. A band adjustment layer is formed on the channel region. By adjusting the band structure, the local two-dimensional hold gas (2DHG) is eliminated. An enhancement mode high hole mobility transistor is formed and the keeps good uniformity and low channel resistance. In addition, a dielectric layer may be disposed between the band adjustment layer and the gate electrode to suppress the gate leakage current, raise the withstand gate voltage, and further lower the channel resistance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high hole mobility transistor (HHMT), comprising:
   a back-barrier layer disposed on a substrate;
   a conducting layer disposed on the back-barrier layer;
   a channel region disposed in the conducting layer adjacent to an interface between the conducting layer and the back-barrier layer;
   a doping layer disposed on the conducting layer;
   a gate electrode disposed on the doping layer;
   source/drain electrodes respectively disposed on opposite sides of the gate electrode;
   a band adjustment layer disposed on the doping layer and electrically connected to the gate electrode; and
   a dielectric layer disposed between the band adjustment layer and the gate electrode, wherein the dielectric layer directly contacts a bottom surface of the gate electrode;
   wherein the band adjustment layer is an N-type doped III-V semiconductor.

2. The high hole mobility transistor as claimed in claim 1, wherein the band adjustment layer comprises N-type doped GaN, AlGaN, AlN, GaAs, AlGaAs, InP, InAlAs, or InGaAs.

3. The high hole mobility transistor as claimed in claim 1, wherein an N-type doping concentration of the band adjustment layer is between $1e15/cm^3$ and $1e20/cm^3$.

4. The high hole mobility transistor as claimed in claim 1, wherein the back-barrier layer comprises $Al_xGa_{1-x}N$ or $Al_xIn_yGa_{1-x-y}N$, wherein $0<x<1$ and $0<y<1$.

5. The high hole mobility transistor as claimed in claim 1, wherein the conducting layer comprises GaN.

6. The high hole mobility transistor as claimed in claim 1, wherein the doping layer comprises P-type doped GaN.

7. The high hole mobility transistor as claimed in claim 6, wherein the doping layer is doped by Mg, Zn, Ca, Be, Sr, Ba, Ra, or C.

8. The high hole mobility transistor as claimed in claim 1, wherein the substrate comprises a III-V semiconductor.

9. The high hole mobility transistor as claimed in claim 1, further comprising:
   a passivation layer covering the doping layer and the band adjustment layer.

10. The high hole mobility transistor as claimed in claim 9, wherein the passivation layer comprises $SiO_2$, $SiN_3$, SiON, $Al_2O_3$, AlN, polyimide (PI), benzocyclobutene (BCB), or polybenzoxazole (PBO).

11. The high hole mobility transistor as claimed in claim 1, wherein the dielectric layer comprises $SiO_2$, $SiN_3$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, $AlSiN_3$, SiC, or $Ta_2O_5$.

12. The high hole mobility transistor as claimed in claim 1, wherein the dielectric layer extends to a top surface of the doping layer.

13. The high hole mobility transistor as claimed in claim 1, wherein the dielectric layer extends to a top surface of the passivation layer.

* * * * *